US007545663B2

(12) United States Patent
Ikeda et al.

(10) Patent No.: US 7,545,663 B2
(45) Date of Patent: Jun. 9, 2009

(54) SEMICONDUCTOR STORAGE DEVICE

(75) Inventors: Hiroaki Ikeda, Tokyo (JP); Mamoru Sasaki, Hiroshima (JP); Atsushi Iwata, Hiroshima (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/440,398

(22) Filed: May 25, 2006

(65) Prior Publication Data
US 2007/0005876 A1 Jan. 4, 2007

(30) Foreign Application Priority Data
May 25, 2005 (JP) .............................. 2005-152077

(51) Int. Cl.
*G11C 5/06* (2006.01)
(52) U.S. Cl. ...................... 365/63; 365/78; 365/189.02; 365/189.05; 365/189.11; 365/220; 365/221; 711/117; 711/104; 257/700; 257/777; 257/686
(58) Field of Classification Search .................. 365/63, 365/78, 189.02, 189.05, 220, 221, 51, 130, 365/189.11; 711/117, 104; 257/700, 777, 257/686
See application file for complete search history.

(56) References Cited

U.S. PATENT DOCUMENTS

| 4,771,440 | A   | * | 9/1988 | Fromm ........................ 375/279 |
| 6,529,961 | B1  | * | 3/2003 | Bray .......................... 709/250 |
| 6,555,917 | B1  | * | 4/2003 | Heo ........................... 257/777 |
| 6,771,138 | B1  | * | 8/2004 | Dumas et al. ................ 331/143 |
| 7,103,793 | B2  | * | 9/2006 | Rentschler et al. .......... 713/502 |
| 7,123,497 | B2  | * | 10/2006 | Matsui et al. ................. 365/63 |
| 7,221,057 | B2  | * | 5/2007 | Goto .......................... 257/777 |
| 2004/0257847 | A1 | * | 12/2004 | Matsui et al. ................. 365/63 |
| 2005/0152169 | A1 | * | 7/2005 | Goto .......................... 365/63 |
| 2005/0253247 | A1 | * | 11/2005 | Imoto et al. ................. 257/700 |
| 2006/0030121 | A1 | * | 2/2006 | Farrar ........................ 438/455 |
| 2007/0135868 | A1 | * | 6/2007 | Shi et al. ..................... 607/62 |

FOREIGN PATENT DOCUMENTS

| CN | 1540665 | 10/2004 |
| JP | 2004-327474 A | 11/2004 |
| WO | WO 03/103047 A1 | 12/2003 |

OTHER PUBLICATIONS

Chinese Office Action, with English Translation, issued in Chinese Patent Application No. CN 2006100899003 dated on Dec. 12, 2008.

* cited by examiner

*Primary Examiner*—Hoai V Ho
*Assistant Examiner*—Fernando N Hidalgo
(74) *Attorney, Agent, or Firm*—McDermott Will & Emery LLP

(57) ABSTRACT

Data transfer speed is increased in a semiconductor storage device in which the core unit and the interface unit are separate chips. The device has a plurality of core chips through in which a memory cell is formed, and an interface chip in which a peripheral circuit is formed for the memory cell. The plurality of core chips through have latch circuit units through for temporarily storing data to be outputted by the memory cell, and latch circuit units through for temporarily storing data to be inputted to the memory cell, respectively, and these latch circuit units through and latch circuit units through are connected in a cascade to the interface chip. Since the plurality of latch circuit units connected in a cascade can thereby perform a pipeline operation, it becomes possible to achieve high-speed data transfer.

21 Claims, 19 Drawing Sheets

SEMICONDUCTOR STORAGE DEVICE

TECHNICAL FIELD

The present invention relates to a semiconductor storage device, and particularly relates to a semiconductor storage device in which separate chips are used to form a core unit in which a memory cell is formed, and to form an interface unit in which a peripheral circuit is formed for the memory cell.

BACKGROUND OF THE INVENTION

The storage density of a semiconductor memory device as represented by a DRAM (Dynamic Random Access Memory) is increasing in recent years, and a high speed is also required. The increase of the storage density has so far been achieved mainly by downsizing of memory cells and increase of chip sizes. However, there is a certain physical limit to a reduction in the size of the memory cell, and the increase in the chip size decreases productivity and hinders a speed increase.

In order to substantially solve the above problems, there is proposed a method of using separate chips for the core section that is formed with memory cells and the interface section that is formed with a peripheral circuit of the memory cells (see Japanese Patent Application Laid-open No. 2004-327474). According to this method, a semiconductor memory device that has conventionally one chip is divided into plural chips. Therefore, the size of one chip can be decreased substantially. Consequently, according to this method, it is expected to be able to achieve a larger density while securing high productivity.

When the core section and the interface section are formed using separate chips, core chips can be manufactured in the memory process, and the interface chips can be manufactured in the logic process. In general, a transistor manufactured in the logic process can achieve higher-speed operation than a transistor manufactured in the memory process. Therefore, when the interface chip is manufactured in the logic process, the circuit of the interface chip section can be operated at a higher speed than that conventionally achieved. Accordingly, the semiconductor memory device can achieve high-speed operations. Furthermore, the operation voltage of the interface chip can be decreased to about 1V, thereby decreasing power consumption.

FIG. 19 is a schematic diagram of the structure of a conventional semiconductor storage device in which the core unit and interface unit are separate chips, and shows an example in which four core chips 21 to 24 are allocated to one interface chip 10.

As shown in FIG. 19, the core chips 21 to 24 are provided with core units 21a to 24a, as well as data input-output circuits 21b to 24b. The input-output circuits 21b to 24b are connected in common to the interface chip 10 via through-electrodes 21c to 24c that are provided through the core chips 21 to 24, respectively.

Therefore, when data are written to any of the core chips 21 to 24, write data are supplied from the interface chip 10 to the through-electrodes 21c to 24c, and these data are latched by any of the data input-output circuits 21b to 24b. Conversely, when data are read from any of the core chips 21 to 24, read data are supplied to the through-electrodes 21c to 24c from any one of the data input-output circuits 21b to 24b, and these data are latched by the interface chip 10.

However, since the through-electrodes 21c to 24c for connecting the core chips 21 to 24 with the interface chip 10 are shared by the core chips in the conventional semiconductor storage device shown in FIG. 19, the through-electrodes 21c to 24c are occupied by the data to be written to one core chip, or by the data to be read from one core chip. The through-electrodes are therefore utilized with low efficiency, and high-speed data transfer is difficult to perform.

This problem can be overcome by connecting the through-electrodes 21c to 24c to the interface chip 10 by a different route for each core chips 21 to 24 without short-circuiting. However, when this configuration is adopted, not only does the number of through-electrodes increase in relation to the number of core chips layered, but the position in which the through-electrodes are formed changes for each chip. It is therefore impossible to manufacture these core chips 21 to 24 using the same mask, and this configuration is impractical.

Stray capacitance also increases due to the common connection of the through-electrodes 21c to 24c, and prevents data transferring in high-speed. These problems also become more severe as the number of layered core chips is increased in order to increase the storage capacity.

SUMMARY OF THE INVENTION

The present invention was developed in order to overcome such problems. It is therefore an object of the present invention to increase the speed of data transfer in a semiconductor storage device in which the core unit and interface unit are separate chips.

The above and other objects of the present invention can be accomplished by a semiconductor storage device, comprising: a plurality of core chips having at least a memory cell; and an interface chip having at least a peripheral circuit for said memory cell, wherein each of said plurality of core chips further has a latch circuit unit for temporarily storing at least one of input data to be inputted to said memory cell and the output data to be outputted from said memory cell, and said latch circuit unit provided to each of said plurality of core chips is connected in a cascade to said interface chip.

According to the present invention, since pipeline operation can be performed by the latch circuit units provided to the core chips, it becomes possible to transfer data at a higher speed compared to the conventional semiconductor storage device.

In the present invention, it is preferable that the plurality of core chips and the interface chip are layered together. In this case, it is preferable that the plurality of core chips includes at least a first core chip and a second core chip, the latch circuit units provided to the first and second core chips being connected to each other via at least a through-electrode provided to one of the first and second core chips. Further, it is preferable that the latch circuit unit provided to a predetermined core chip and an internal circuit provided to the interface chip are connected to each other via at least a through-electrode provided to one of the predetermined core chip and the interface chip.

In this configuration, since the through-electrodes provided to the core chips are separated from each other by a latch circuit unit rather than being connected in common, the stray capacitance of the through-electrodes is low, and high-speed data transfer therefore becomes possible.

There may be a single pipeline or a plurality of pipelines in the present invention. When there are a plurality of pipelines, the groups of through-electrodes constituting each pipeline are preferably arranged in a spiral pattern. It thereby becomes possible to keep the number of through-electrodes constant; specifically, the same as the number of groups, regardless of the number of core chips layered, and core chips having the same structure can be used.

The above and other objects of the present invention can also be accomplished by a semiconductor storage device having a plurality of semiconductor chips that include a plurality of core chips in which at least a memory cell is formed and an interface chip in which at least a peripheral circuit corresponding to said memory cell is formed, and adjacent semiconductor chips are connected to each other via through-electrodes provided to at least a part of the semiconductor chips, said semiconductor storage device comprising: a serial-parallel conversion means for temporarily storing write data supplied in serial by said interface chip via said through-electrode, and supplying said temporarily stored write data in parallel to an internal circuits of the plurality of core chips; and a parallel-serial conversion means for temporarily storing the read data outputted in parallel by the internal circuits of said core chips, and supplying said temporarily stored read data in serial to said interface chip via said through-electrode.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
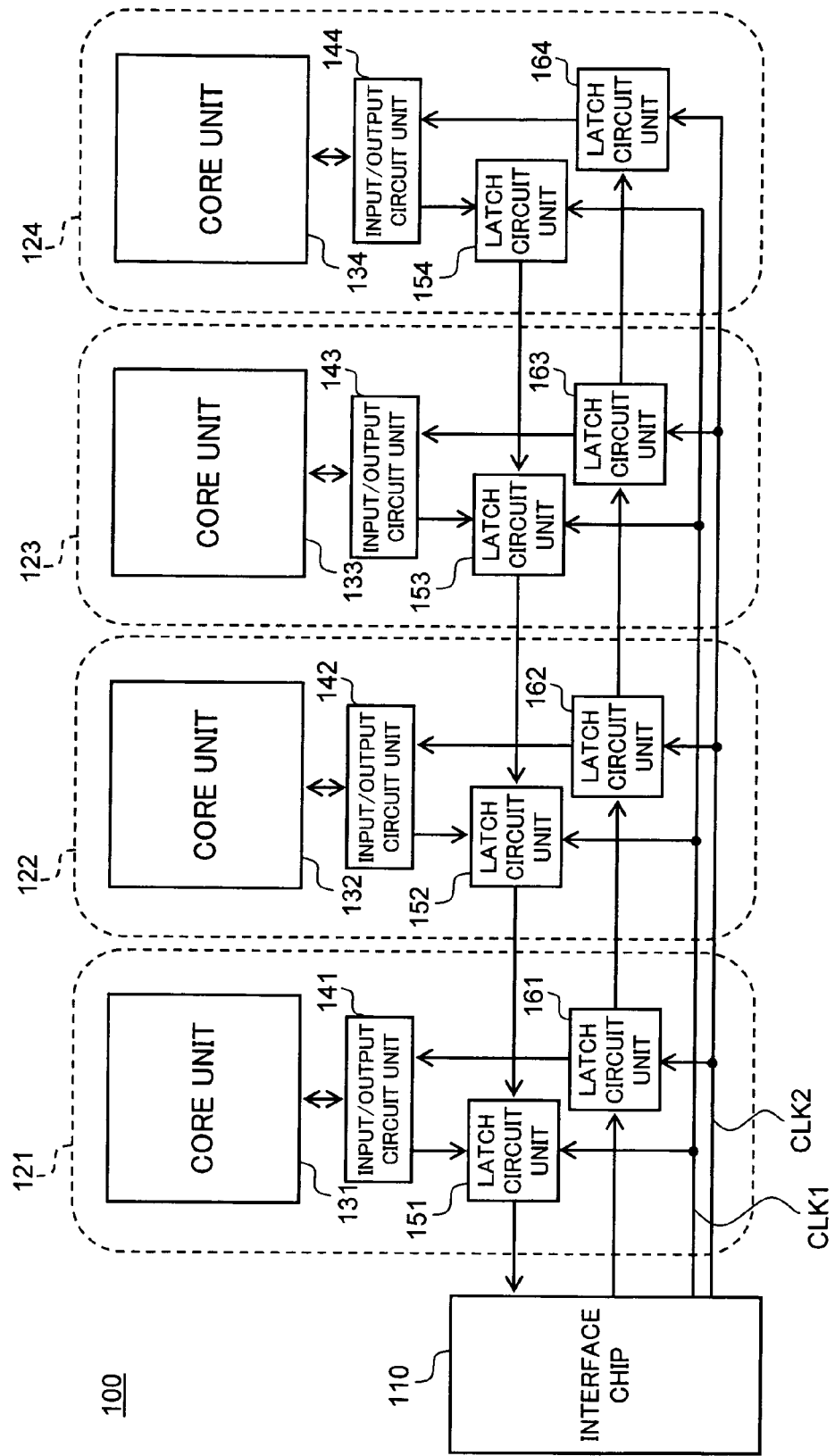
FIG. 1 is a schematic block diagram showing the circuit structure of the semiconductor storage device according to a first preferred embodiment of the present invention.

FIG. 1 is a schematic block diagram showing the circuit structure of the semiconductor storage device 100 according to a first preferred embodiment of the present invention.

As shown in FIG. 1, the semiconductor storage device 100 according to the present embodiment includes one interface chip 110 and four core chips 121 to 124. As described hereinafter, the interface chip 110 and the core chips 121 to 124 are layered together.

The four core chips 121 to 124 are provided with core units 131 to 134 in which memory cells are formed, input/output circuit units 141 to 144, first latch circuit units 151 to 154, and second latch circuit units 161 to 164, respectively. The first latch circuit units 151 to 154 are circuits for temporarily storing the data outputted by the core units 131 to 134, and the second latch circuit units 161 to 164 are circuits for temporarily storing the data to be inputted to the core units 131 to 134.

A first clock signal CLK1 is supplied in common by the interface chip 110 to the first latch circuit units 151 to 154, whereby the first latch circuit units 151 to 154 operate in synchrony with the first clock signal CLK1. The first latch circuit units 151 to 154 are connected in a cascade to the interface chip 110, and the first latch circuit units 151 to 154 therefore function as a parallel-serial conversion device for supplying data that are read in parallel from the core units 131 to 134 in serial to the interface chip 110.

In the same manner, a second clock signal CLK2 is supplied in common by the interface chip 110 to the second latch circuit units 161 to 164, whereby the second latch circuit units 161 to 164 function in synchrony with the second clock signal CLK2. The second latch circuit units 161 to 164 are also connected in a cascade to the interface chip 110, and the second latch circuit units 161 to 164 therefore function as a serial-parallel conversion device for supplying write data supplied in serial by the interface chip 110 to the core units 131 to 134 in parallel.

Figure 2:
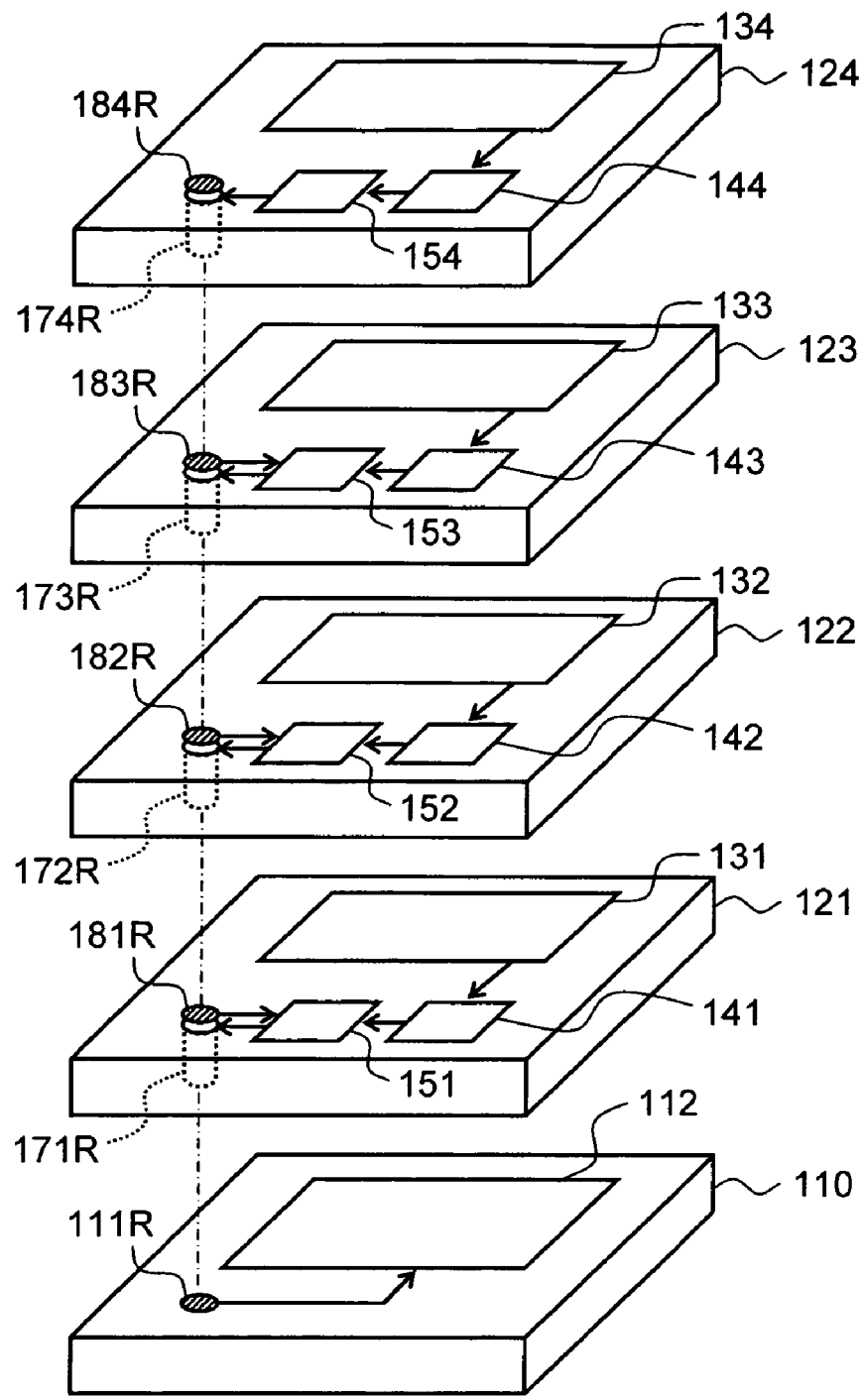
FIG. 2 is a schematic exploded perspective view of the layering structure of the semiconductor storage device shown in FIG. 1, wherein the arrows indicate the flow of data during the read operation.

FIG. 2 is a schematic exploded perspective view of the layering structure of the semiconductor storage device 100 according to the present embodiment, wherein the arrows indicate the flow of data during the read operation.

Figure 3:
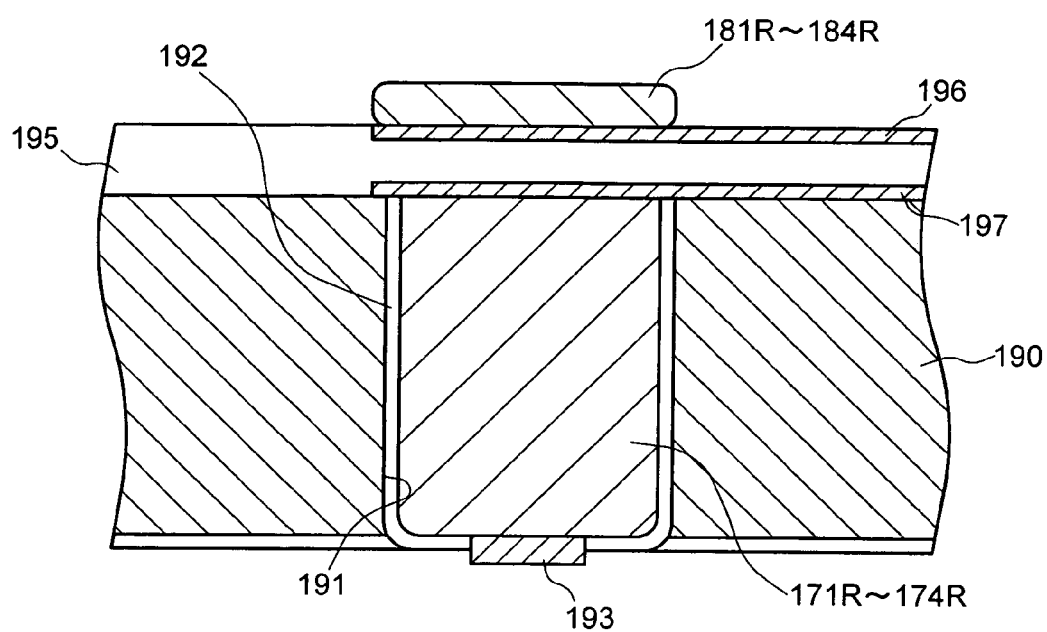
FIG. 3 is a partial cross sectional view showing an area that through-electrodes are formed.

As shown in FIG. 2, the semiconductor storage device 100 according to the present embodiment has a structure in which the interface chip 110 and the core chips 121 to 124 are layered in this sequence, and through-electrodes 171R to 174R are provided to the core chips 121 to 124, respectively. As shown in the partial sectional view of FIG. 3, the through-electrodes 171R to 174R are electrodes that are filled via an insulating film 192 into a through-hole 191 provided in a P-type semiconductor substrate 190, and a rear surface bump 193 is provided to the bottom end side thereof (the underside of the semiconductor substrate 190). As shown in FIG. 3, this rear surface bump 193 is electrically connected directly to the through-electrodes 171R to 174R.

The surface bumps 181R to 184R provided to the top end side (surface side of the semiconductor substrate 190) of the through-electrodes 171R to 174R are positioned directly above the through-electrodes 171R to 174R, but are separated therefrom by an insulating film 195. There is therefore no direct connection between the through-electrodes 171R to 174R and the surface bumps 181R to 184R. The surface bumps 181R to 183R are connected to the input terminals of the first latch circuit units 151 to 154 via wiring 196, as shown in FIG. 2. The through-electrodes 171R to 174R are connected to the output terminals of the first latch circuit units 151 to 154 via wiring 197, as shown in FIG. 2.

Between two adjacent core chips (for example, between core chip 121 and core chip 122), the rear surface bump 193 of the core chip (core chip 122) in the upper layer position is electrically connected by layering to the surface bumps 181R to 184R of the core chip (core chip 121) in the lower layer position. Therefore, when these four core chips 121 to 124 and the interface chip 110 are layered, surface bump 181R and through-electrode 172R, surface bump 182R and through-electrode 173R, and surface bump 183R and through-electrode 174R are each short-circuited by layering. Through-electrode 171R and the read-data terminal 111R on the interface chip 110 are also short-circuited by layering.

The distinction between "upper layer" and "lower layer" is purely for convenience, and this distinction can be reversed according to the method of layering the core chips 121 to 124, as described hereinafter.

Figure 4:
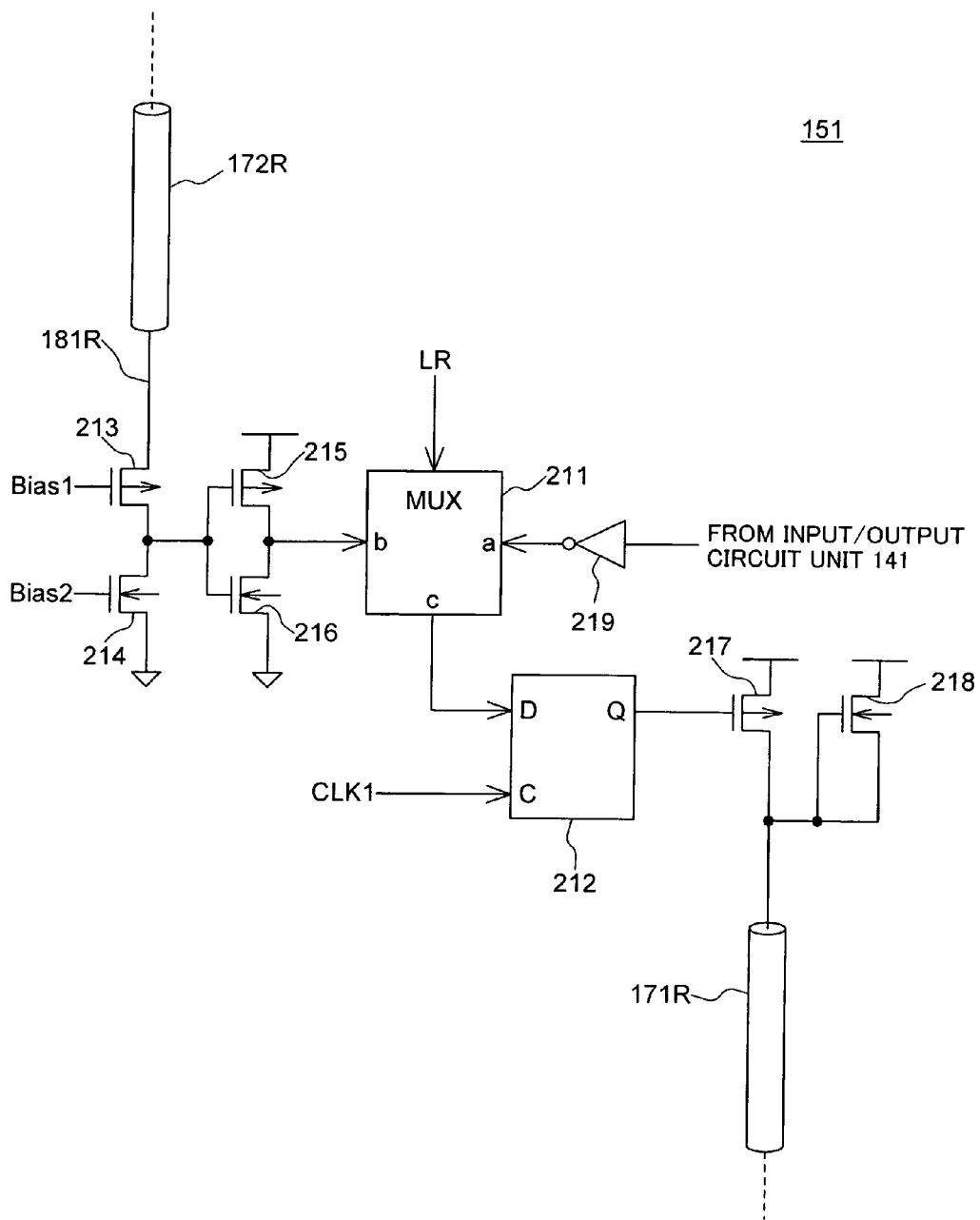
FIG. 4 is a circuit diagram showing the structure of the first latch circuit unit shown in FIG. 2.

FIG. 4 is a circuit diagram showing the structure of the first latch circuit unit 151 in further detail.

As shown in FIG. 4, the first latch circuit unit 151 is provided with a multiplexer 211 and a data latch 212. The multiplexer 211 is a circuit for outputting any one of the data supplied to a first input terminal a and the data supplied to a second input terminal b from an output terminal c according to a latch signal LR.

The data supplied to the first input terminal a are read data supplied by the core unit 131 via an input/output circuit unit 141 and an inverter 219, and the data supplied to the second input terminal b are read data transferred by the upper layer core chip 122. Therefore, when the latch signal LR selects the first input terminal a (LR=high-level) the read data supplied by the core unit 131 are supplied to the data latch 212. Conversely, when the latch signal LR selects the second input terminal b (LR=low-level), the read data transferred by the upper layer core chip 122 are supplied to the data latch 212.

The read data transferred by the upper layer core chip 122 are supplied via the through-electrode 172R and surface bump 181R to a series circuit composed of a P-channel MOS transistor (PMOS) 213 and an N-channel MOS transistor (NMOS) 214. Bias signals Bias1 and Bias2 are supplied to the gates of the PMOS 213 and the NMOS 214, respectively. At this time, when the W/L ratio (gate width/gate length ratio) of the PMOS 213 is increased, the fluctuation in potential of the through-electrode 172R and the surface bump 181R can be minimized in relation to the amount of current flowing through the through-electrode 172R and the surface bump 181R.

The NMOS 214 constitutes a constant-current circuit, and when the current that is caused to flow through the PMOS 213 to the output terminal, i.e., the junction between the PMOS 213 and the NMOS 214, is larger or smaller than the value of the constant current created by the NMOS 214, the output terminal changes significantly to high and low potentials. This junction (output terminal) is supplied to the data latch 212 via the multiplexer 211 and an inverter composed of a PMOS 215 and an NMOS 216.

The data latch 212 is provided with a data input terminal D, a clock input terminal C, and a data output terminal Q, as shown in FIG. 4. The data latch 212 temporarily stores the data through the data input terminal D and outputs the data from the data output terminal Q in synchrony with the first clock signal CLK1 supplied to the clock input terminal C. Data from the data output terminal Q are supplied to the gate of a PMOS 217 connected between the power source potential and the through-electrode 171R. The PMOS 217 constitutes a driver circuit for supplying a current to the through-electrode 171R according to the output of the data latch 212.

In order to supply a current to the through-electrode 171R, the PMOS 217 that is the driver circuit should be turned ON. A current is not supplied from PMOS 217 when the PMOS 217 is turned OFF. This current is detected by the PMOS 213 and NMOS 214 of the next-stage circuit, and the data are regenerated.

In the case where a current is not supplied to the through-electrode 171R, the through-electrode potential that is held constant by the PMOS 213 of the next stage becomes unstable. An NMOS 218 that is connected as a diode and has a low W/L ratio is therefore provided between the through-electrode 171R and the power source potential, and when the PMOS 217 is OFF, a weak current is supplied to the through-electrode 171R in order to stabilize the voltage of the through-electrode.

Since a current mode system is thus employed for signal transmission in the present embodiment, the voltage amplitude of the through-electrode can be kept extremely small, and it becomes possible to adequately reduce the power consumption involved in signal transmission. Appropriately setting the Bias1 also makes it possible to maintain the through-electrode 171R at a high potential, and the stray capacitance of the through-electrode 171R is significantly reduced. In other words, since the through-electrode 171R is provided so as to pass through the P-type semiconductor substrate 190 as shown in FIG. 3, the depletion layer spreads to the semiconductor substrate 190 in the vicinity of the through-electrode 171R when the through-electrode 171R has a high potential. As a result, it becomes possible to reduce the stray capacitance of the through-electrode 171R.

The configuration of the other first latch circuit units 152 to 154 is exactly the same as the circuit configuration shown in FIG. 4.

Figure 5:
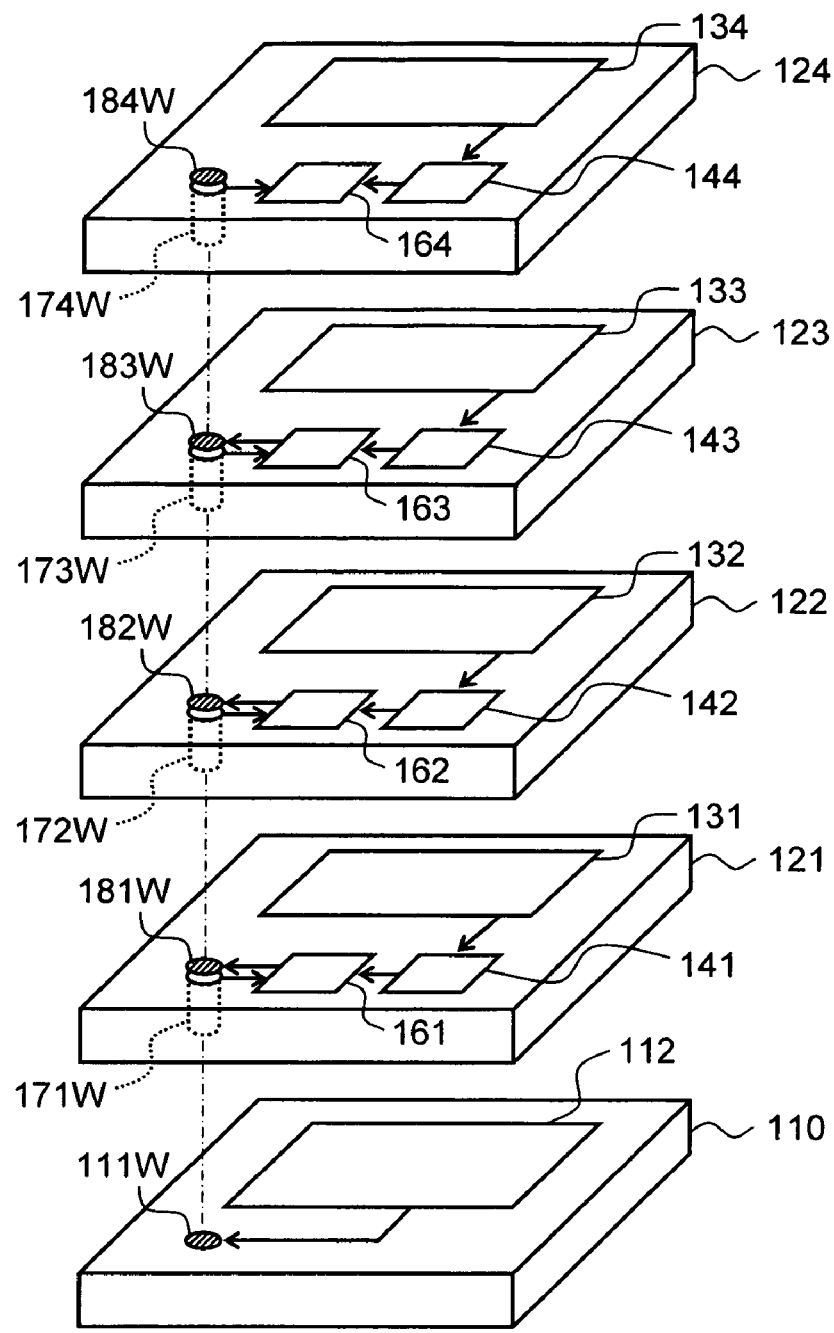
FIG. 5 is a schematic exploded perspective view of the layering structure of the semiconductor storage device shown in FIG. 1, wherein the arrows indicate the flow of data during the write operation.

FIG. 5 is a schematic exploded perspective view of the semiconductor storage device 100, wherein the arrows indicate the flow of data during the write operation.

As shown in FIG. 5, the through-electrodes 171W to 174W used during the write operation differ from the through-electrodes 171R to 174R used during the read operation. The through-electrodes 171W to 174W and the associated structure thereof are exactly the same as shown in FIG. 3. Therefore, the rear surface bump 193 is electrically connected directly to the through-electrodes 171W to 174W, whereas an insulating film 195 is present between the through-electrodes 171W to 174W and the surface bumps 181W to 184W, and there is therefore no direct connection between these components. The through-electrodes 171W to 174W are connected via Wiring 197 to the input terminals of the second latch circuit units 161 to 164, and the surface bumps 181 to 183 are connected via wiring 196 to the output terminals of the second latch circuit units 161 to 164.

Between two adjacent core chips, the rear surface bump 193 of the core chip in the upper layer position is electrically connected by layering to the surface bumps 181W to 184W of the core chip in the lower layer position, as described above. Therefore, when the core chips 121 to 124 are layered, the surface bump 181W and through-electrode 172W, the surface bump 182W and through-electrode 173W, and the surface bump 183W and through-electrode 174W are each short-circuited. The through-electrode 171W and the write-data terminal 111W on the interface chip 110 are also short-circuited by layering.

Figure 6:
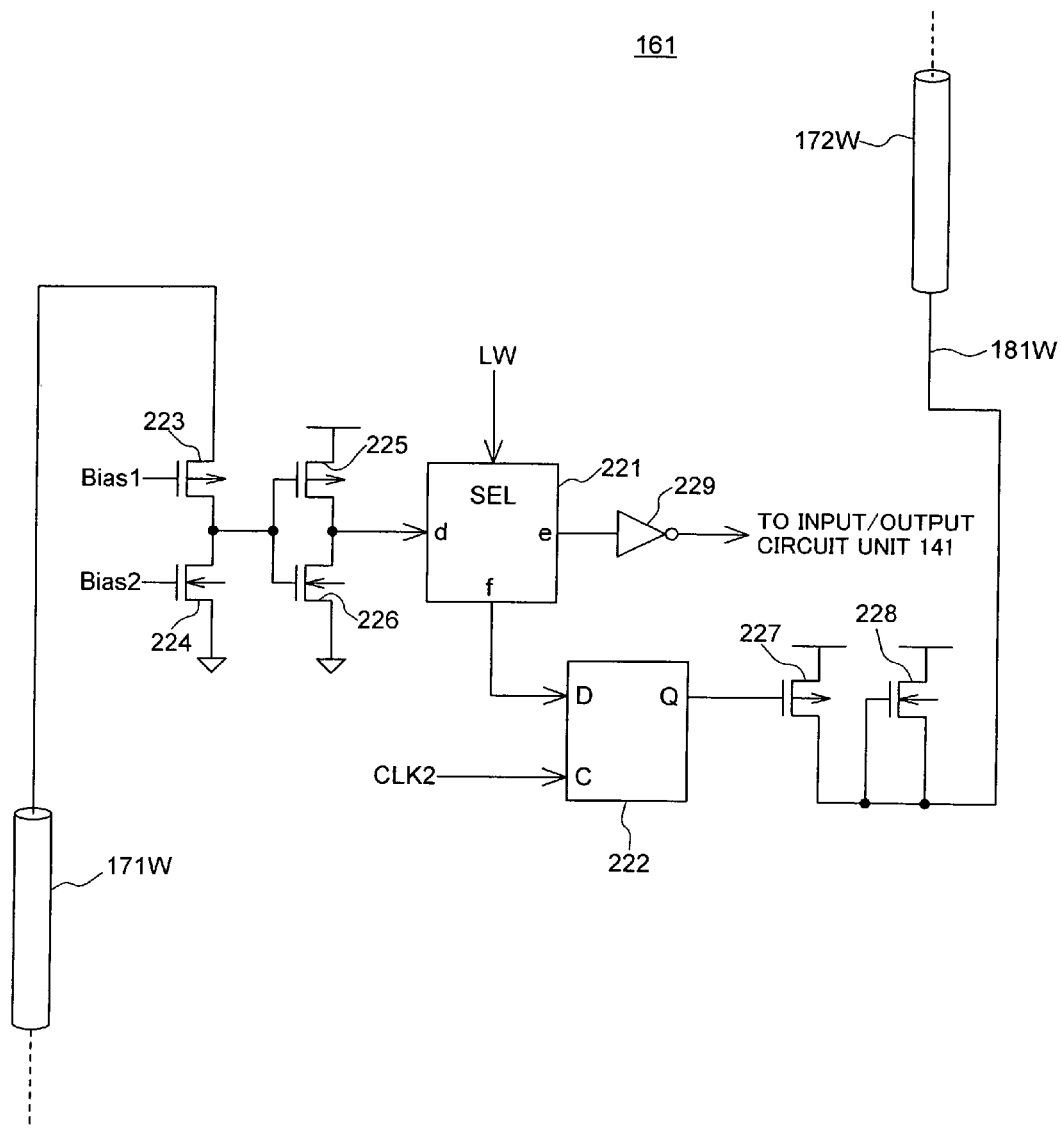
FIG. 6 is a circuit diagram showing the structure of the second latch circuit unit shown in FIG. 5.

FIG. 6 is a circuit diagram showing the structure of the second latch circuit unit 161 in further detail.

As shown in FIG. 6, the second latch circuit unit 161 is configured in substantially the same manner as the first latch circuit unit 151 shown in FIG. 4, except that a selector 221 is substituted for the multiplexer, and data are transmitted in the opposite direction. The selector 221 is a circuit for outputting the data supplied to an input terminal d from either terminal selected from a first output terminal e and a second output terminal f according to a latch signal LW. The data supplied to the input terminal d are write data that are transferred by the lower layer interface chip 110. The write data outputted by the first output terminal e are supplied to the core unit 131 via an inverter 229 and the input/output circuit unit 141, and the write data outputted by the second output terminal f are supplied to a data latch 222.

Therefore, when the latch signal LW selects the first output terminal e (LW=high-level), the write data transferred by the interface chip 110 are supplied to the core unit 131. Conversely, when the latch signal LW selects the second output terminal f (LW=low-level), the write data transferred by the interface chip 110 are transferred to the upper layer core chip 122 via the data latch 222. A second clock signal CLK2 is supplied to the clock input terminal C of the data latch 222 as shown in FIG. 6.

The configuration of the other second latch circuit units 162 to 164 is exactly the same as the circuit configuration shown in FIG. 6.

The configuration of the semiconductor storage device 100 according to the present embodiment is described above. The operation of the semiconductor storage device 100 according to the present embodiment will next be described.

Figure 7:
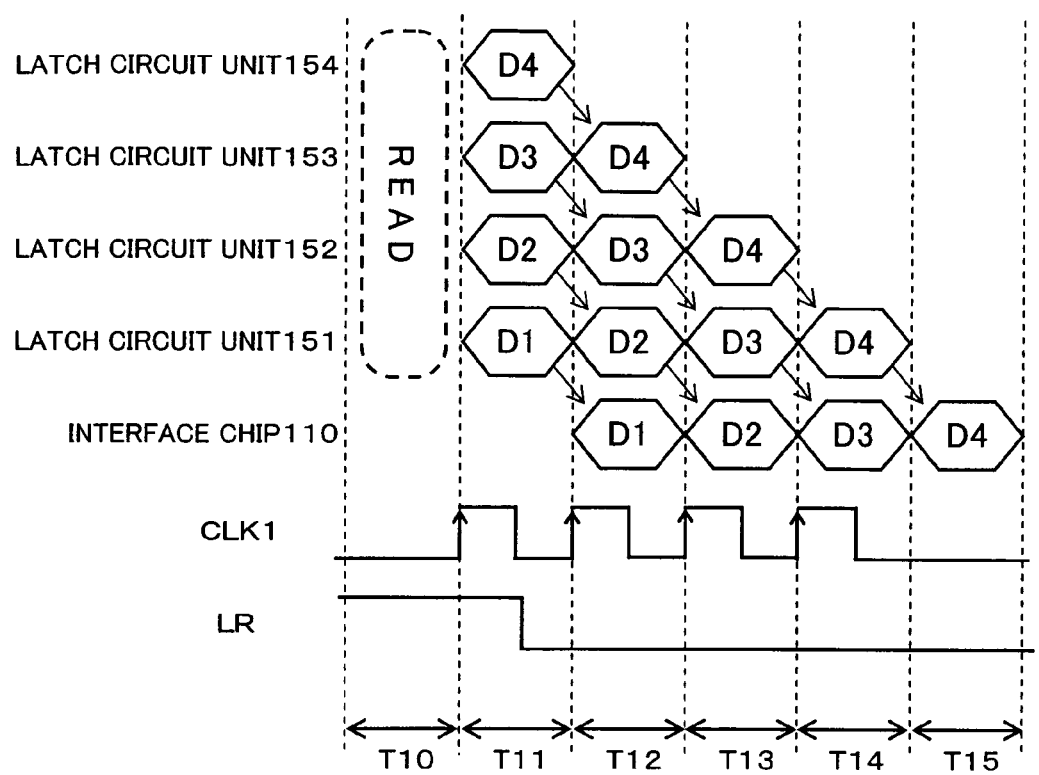
FIG. 7 is a timing chart showing the read operation of the semiconductor storage device shown in FIG. 1.

FIG. 7 is a timing chart showing the read operation of the semiconductor storage device 100 according to the present embodiment.

As shown in FIG. 7, first, the latch signal LR has a high level in the period T10 in which data are simultaneously read by the core units 131 to 134. Therefore, the read data from the core units 131 to 134 are supplied to the data latch 212 (see FIG. 4) of each core chip 121 to 124. In FIG. 7, the read data from the core units 131 to 134 are labeled D1 through D4, respectively.

Then, at the start of period T11, the read data D1 through D4 are simultaneously latched by the corresponding latch circuit units 151 to 154 in synchrony with the first clock signal CLK1. The latch signal LR is then changed to a low level, whereby the read data D1 through D4 thus latched are sequentially shifted in synchrony with the first clock signal CLK1.

As a result, the data D1 through D4 are sequentially transferred in this order to the interface chip 110 during periods T12 through T15. The data D1 through D4 thus transferred to the interface chip 110 are latched by an internal circuit 112 according to a clock signal (not shown) that is synchronized with the first clock signal CLK1.

The data that are thus read in parallel by the core chips 121 to 124 are temporarily stored in the latch circuit units 151 to 154, respectively, and are then supplied in serial to the internal circuit 112 of the interface chip 110 in synchrony with the first clock signal CLK1.

Figure 8:
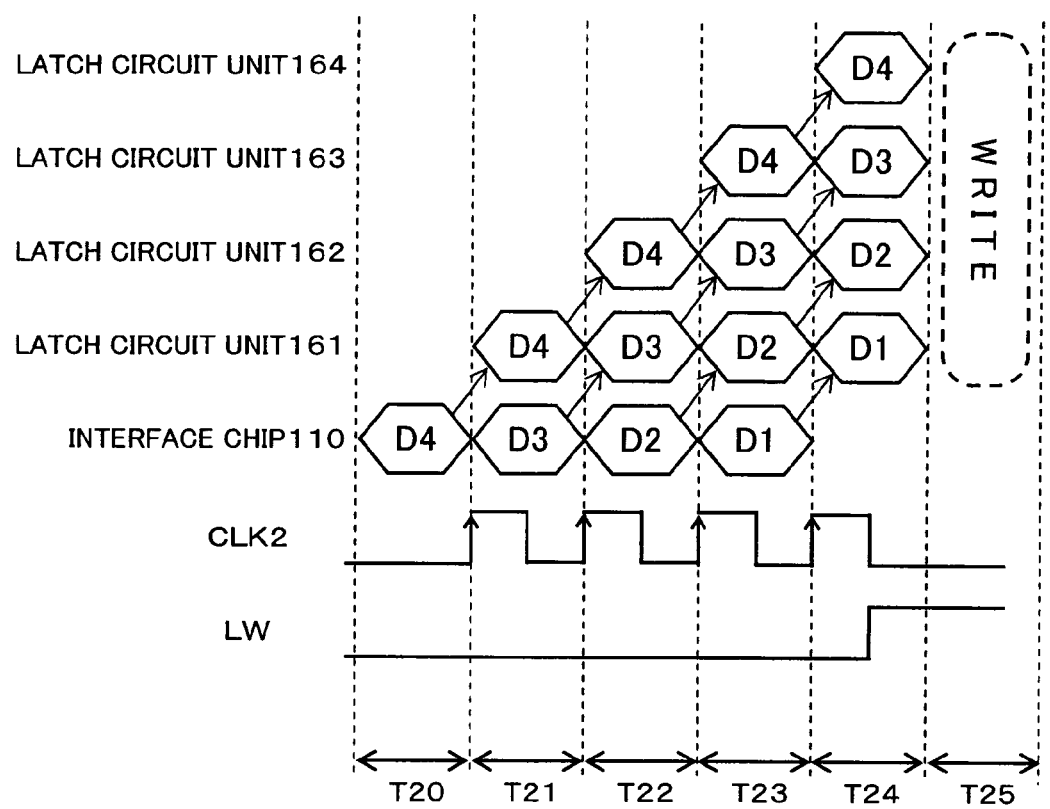
FIG. 8 is a timing chart showing the write operation of the semiconductor storage device shown in FIG. 1.

FIG. 8 is a timing chart showing the write operation of the semiconductor storage device 100 according to the present embodiment.

As shown in FIG. 8, the latch signal LW has a low level during periods T20 through T23. Therefore, the write data D4 through D1 red by the interface chip 110 are sequentially shifted by the data latch 222 (see FIG. 6) included in the core chips 121 to 124 in synchrony with the second clock signal CLK2.

When these pieces of read data D4 through D1 are latched at the start of period T24 by the latch circuit units 164 to 161, respectively, the latch signal LW changes to a high level, whereby the output of the selector 221 is switched to the first output terminal e. As a result, the write data D1 through D4 are supplied to the core units 131 to 134, respectively. Data are then simultaneously written by the core units 131 to 134 during period T25.

The write data thus supplied in serial by the interface chip 110 are sequentially transmitted to the latch circuit units 161 to 164 of the core chips 121 to 124 in synchrony with the second clock signal CLK2, and are then written in parallel in the core units 131 to 134, respectively.

In the semiconductor storage device 100 according to the present embodiment as described above, the through-electrodes 171R to 174R that form the transmission path of the read data, and the through-electrodes 171W to 174W that form the transmission path of the write data are not shared by the core chips 121 to 124, but are separated by the first latch circuit units 151 to 153 and the second latch circuit units 161 to 163.

It therefore becomes possible to perform the abovementioned pipeline operation. Since the through-electrodes 171R to 174R and the through-electrodes 171W to 174W are also separated from each other, the stray capacitance of the through-electrodes is small compared to the conventional semiconductor storage device, and high-speed data transfer is therefore possible.

Chips having exactly the same structure can also be used as the core chips 121 to 124. These core chips 121 to 124 can therefore be manufactured using the same mask, and it becomes possible to have a constant (two for each I/O) number of through-electrodes regardless of the number of layered core chips.

Figure 9:
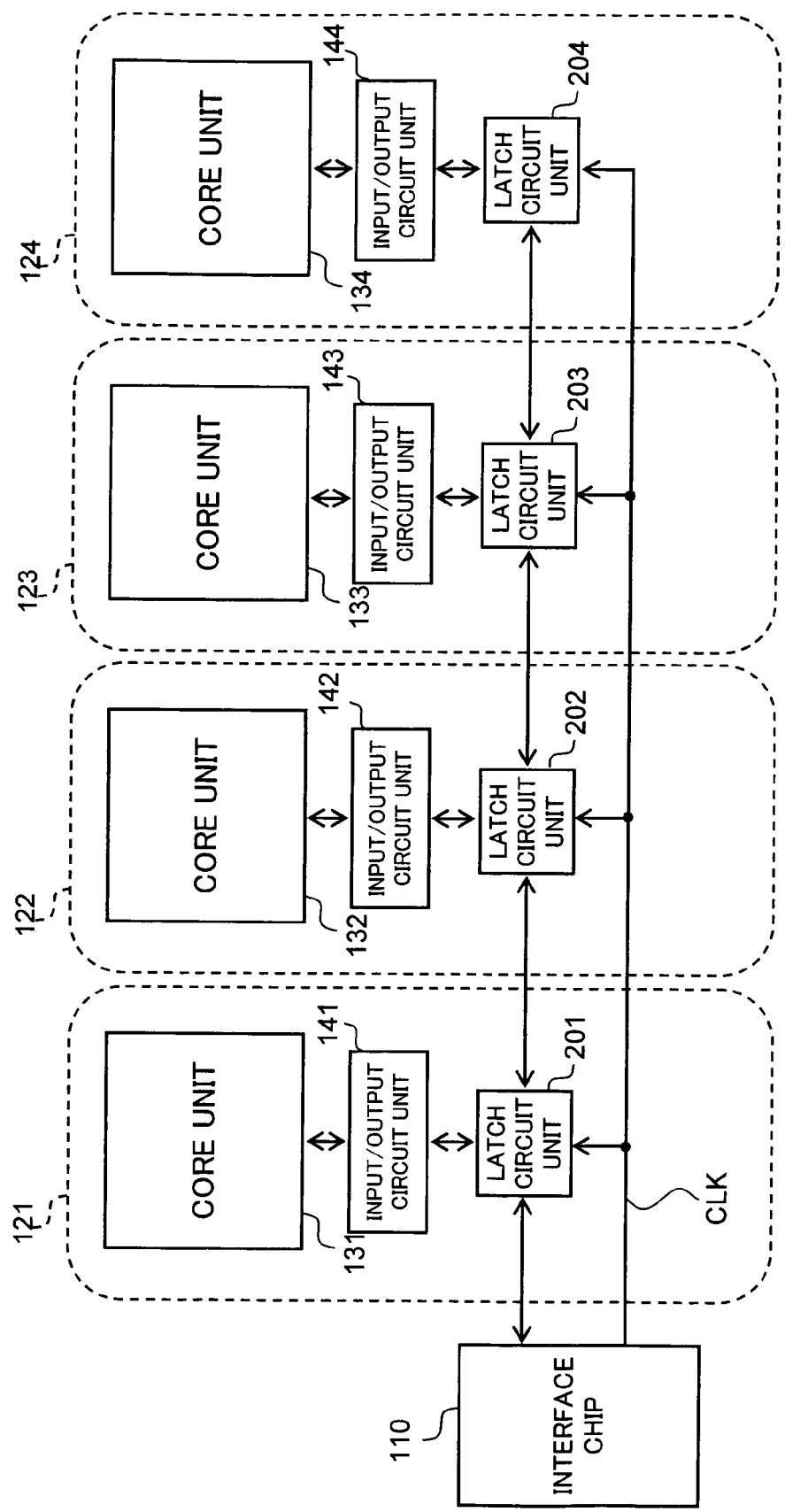
FIG. 9 is a schematic block diagram showing a modified circuit structure of the first embodiment of the present invention.

In the embodiment described above, the through-electrodes 171R to 174R are used as the data transmission path during the read operation, and the through-electrodes 171W to 174W are used as the data transmission path during the write operation, but these through-electrodes may also be used for both reading and writing. In this case, rather than separately using a latch circuit for reading and a latch circuit for writing, bi-directional latch circuits 201 to 204 may be used, as shown in FIG. 9. A single clock signal CLK may be used as the clock signal.

Several methods for layering the interface chip 110 with the core chips 121 to 124 will next be described.

Figure 10:
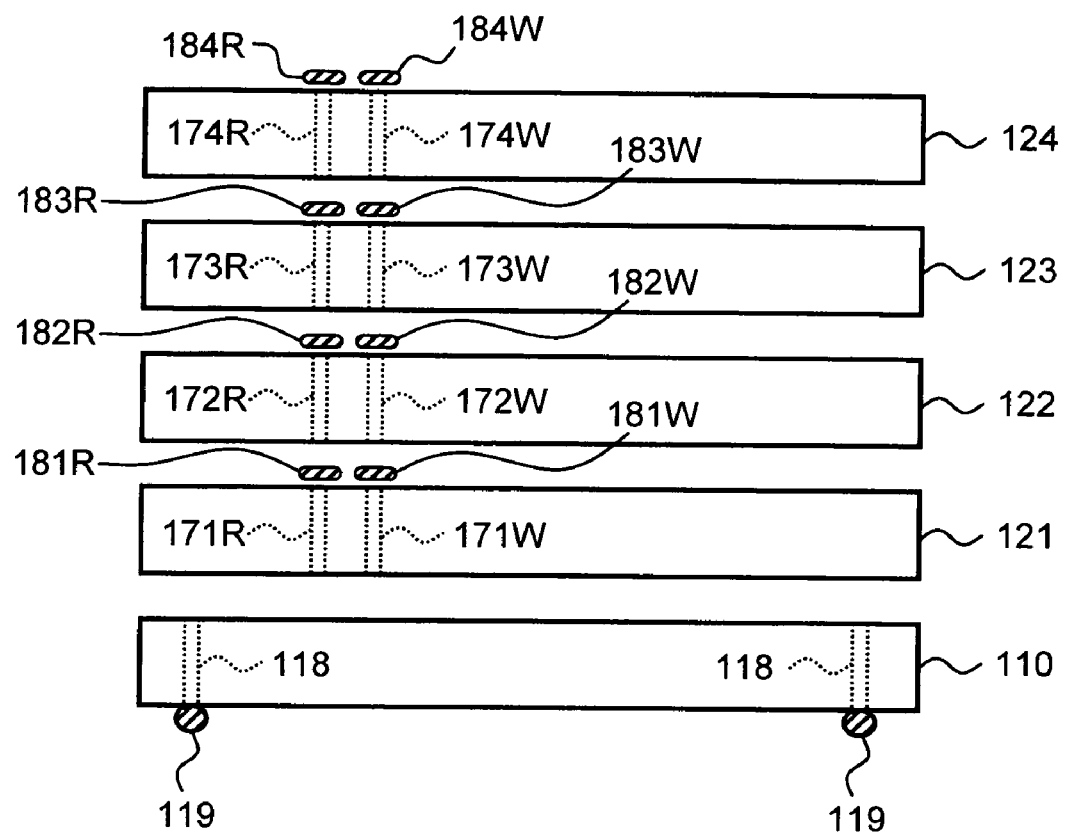
FIG. 10 is a schematic sectional view used to describe the first layering method.

FIG. 10 is a schematic sectional view used to describe the first layering method.

The layering method shown in FIG. 10 is a method whereby the interface chip 110 is positioned as the bottom layer, and the core chips 121 to 124 are layered in this sequence on the interface chip 110. According to this layering method, through-electrodes 118 are also provided to the interface chip 110 positioned as the bottom layer, and signals are exchanged with an external circuit via an external terminal 119 formed on the back surface. An advantage of this layering method is that no other chips are required besides the interface chip and the core chips.

Figure 11:
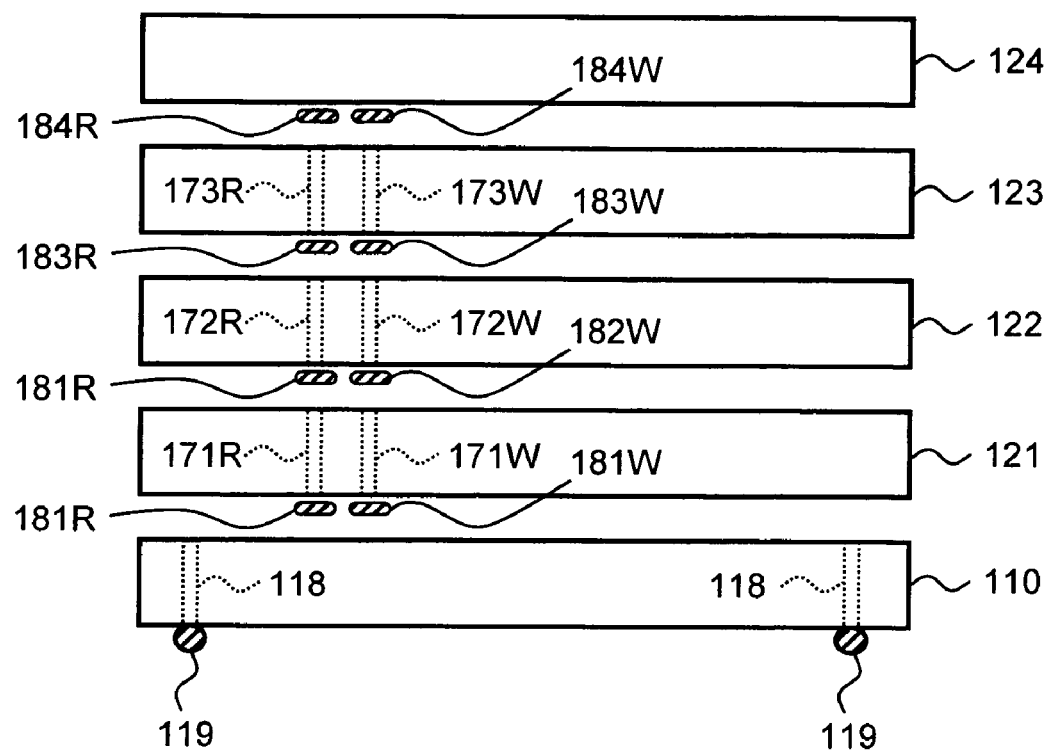
FIG. 11 is a schematic sectional view used to describe the second layering method.

FIG. 11 is a schematic sectional view used to describe a second layering method.

The layering method shown in FIG. 11 differs from the first layering method shown in FIG. 10 in that the core chips 121 to 124 are layered face-down. This layering method makes it unnecessary to provide through-electrodes to the core chip 124 positioned as the top layer.

Figure 12:
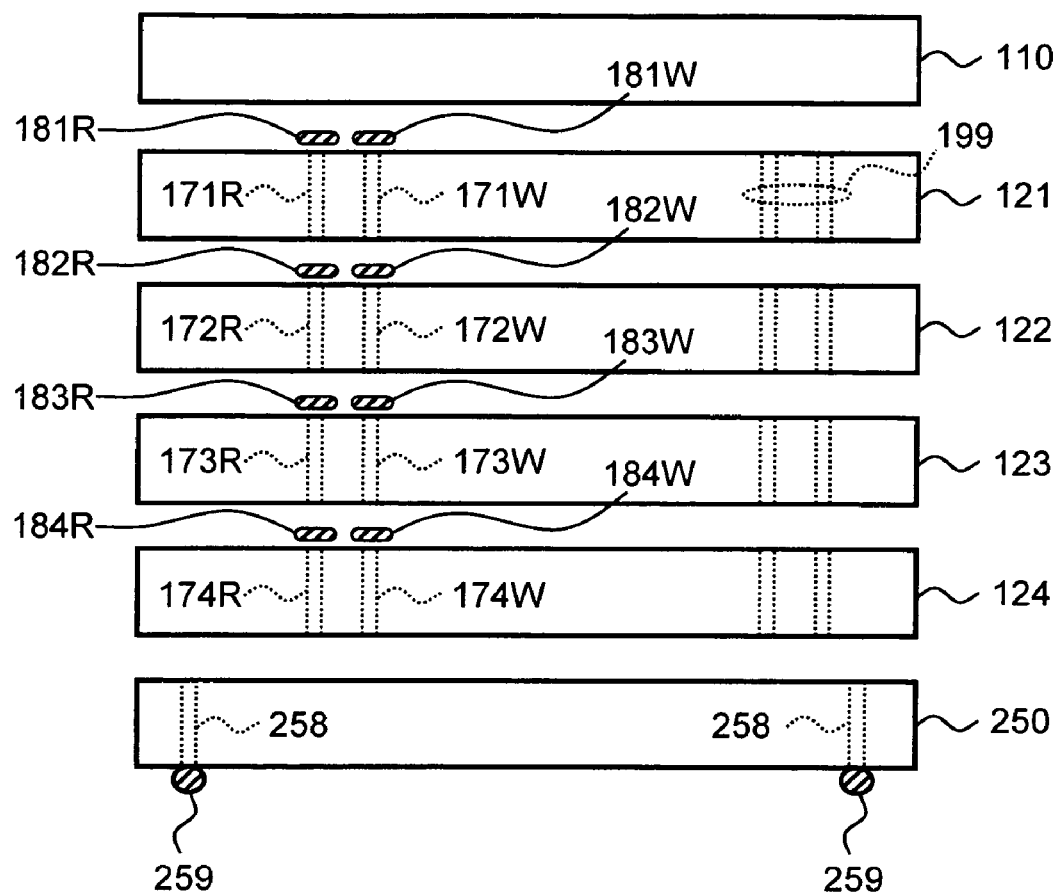
FIG. 12 is a schematic sectional view used to describe the third layering method.

FIG. 12 is a schematic sectional view used to describe a third layering method.

The layering method shown in FIG. 12 is a method whereby the interface chip 110 is positioned as the top layer, the core chips 121 to 124 are layered in this sequence under the interface chip 110, and an interposer layer 250 is provided as the bottom layer. The interface chip 110 positioned as the top layer and the interposer layer 250 positioned as the bottom layer are connected to each other via through-electrodes 199 provided to the core chips 121 to 124. This layering method makes it unnecessary to provide through-electrodes to the interface chip 110 positioned as the top layer.

Various other layering methods are possible, but the method of layering these chips is not particularly limited in the present invention, and a layering method other than the methods shown in FIGS. 10 to 12 may also be used. Furthermore, some or all of the chips may be positioned in a plane, rather than being layered. In this case, however, since the degree of integration per unit area decreases significantly, layering the core chips and the interface chip in the manner of the abovementioned embodiment is significantly preferred.

Another preferred embodiment of the present invention will next be described.

Figure 13:
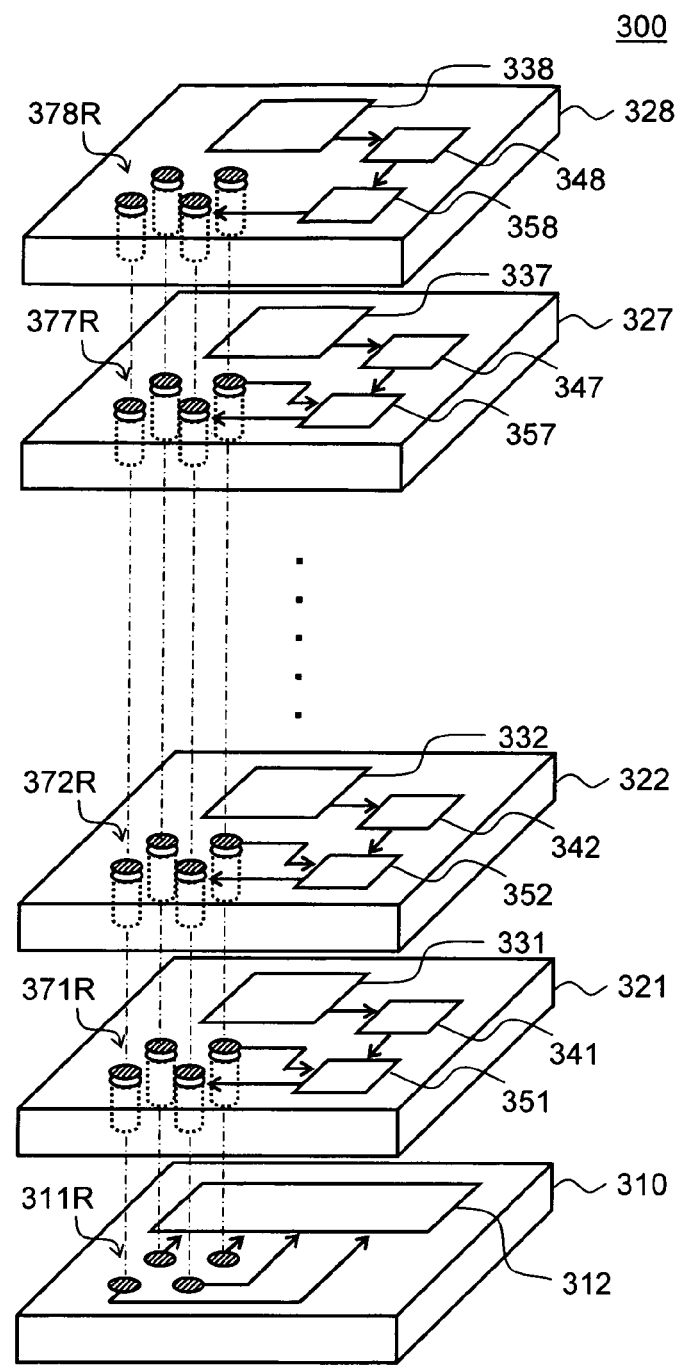
FIG. 13 is a schematic exploded perspective view of the semiconductor storage device according to a second preferred embodiment of the present invention, wherein the arrows indicate the flow of data during the read operation.

FIG. 13 is a schematic exploded perspective view showing the layering structure of the semiconductor storage device 300 according to a second preferred embodiment of the present invention, wherein the arrows indicate the flow of data during the read operation.

As shown in FIG. 13, the semiconductor storage device 300 according to the present embodiment includes one interface chip 310 and eight core chips 321 to 328, and has a structure in which the interface chip 310 and the core chips 321 to 328 are layered in this sequence. The core chips 323 to 326 are omitted in FIG. 13 in order to make the diagram easier to read.

The eight core chips 321 to 328 are provided with core units 331 to 338, input/output circuit units 341 to 348, and first latch circuit units 351 to 358, respectively, in the same manner as in the semiconductor storage device 100 according to the embodiment described above.

However, the present embodiment differs significantly from the semiconductor storage device 100 according to the abovementioned embodiment in that four through-electrodes 371R to 378R used for reading data are provided to the core chips 321 to 328, respectively. Four read-data terminals 311R are provided to the interface chip 310, and these read-data terminals 311R are connected to an internal circuit 312. The four through-electrodes 371R to 378R provided to the core chips 321 to 328 are electrically connected directly to the back-surface bump on the back surface side as shown in FIG. 3, but are not directly connected to the surface bump provided to the surface side.

Figure 14:
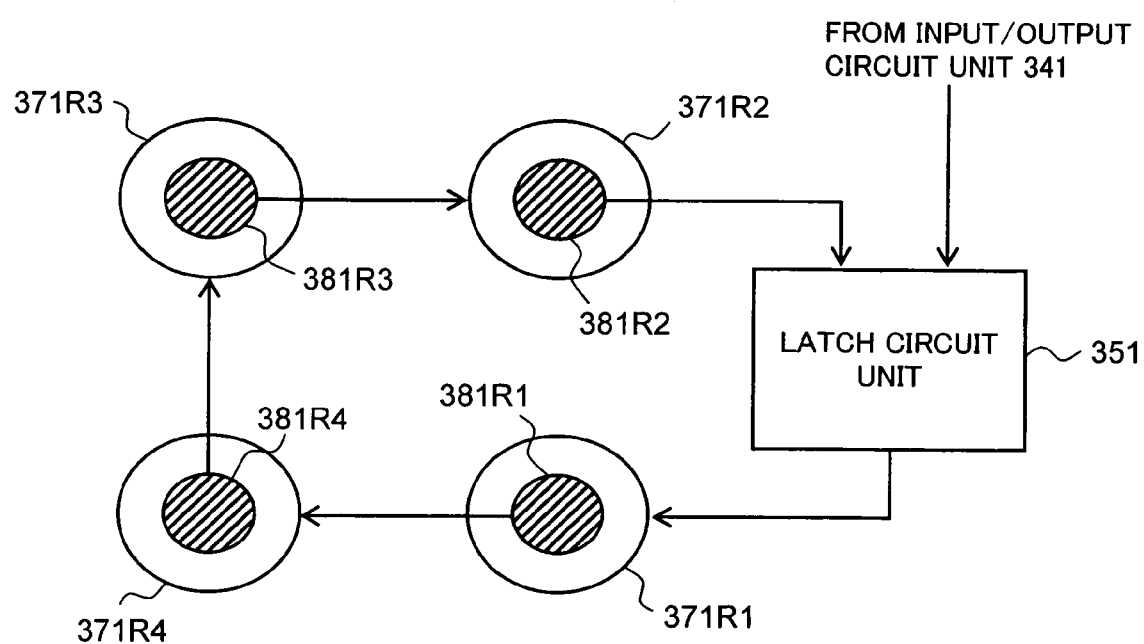
FIG. 14 is a schematic plan view showing the manner in which the four through-electrodes for data reading provided to the core chip are connected to the corresponding surface bumps.

FIG. 14 is a schematic plan view showing the manner in which the four through-electrodes for data reading provided to the core chip 321 are connected to the corresponding surface bumps. The through-electrodes are indicated by large circles, and the surface bumps are indicated by small hatched circles in this drawing in order to make the diagram easier to read, but the diagram is not intended to define the size relationship between the radii of the through-electrodes and the radii of the surface bumps.

As shown in FIG. 14, the surface bumps and the through-electrodes are connected to each other in cyclic fashion. In other words, surface bump 381R1 is connected to through-electrode 371R4, surface bump 381R4 is connected to through-electrode 371R3, surface bump 381R3 is connected to through-electrode 371R2, and surface bump 381R2 is connected to through-electrode 371R1 via a latch circuit unit 351.

Thus, only surface bump 381R2 and through-electrode 371R1 are connected to the first latch circuit unit 351, and the other surface bumps 381R1 to 381R3 and the other through-electrodes 371R2 to 371R4 are not connected to the latch circuit unit 351. These other components therefore simply pass through the core chip 321.

In the core chips 322 to 328 as well, the surface bumps and the through-electrodes are connected to each other in cyclic fashion in the same configuration as the one shown in FIG. 14. When the core chips 321 to 328 are layered, the surface bumps and through-electrodes that are in the same planar position as viewed from the layering direction are short-circuited with each other. The connection relationship when layered is as shown in FIG. 13, and the planar positions of the four through-electrodes and the four corresponding surface bumps are the same in the core chips 321 to 328.

The specific circuit structure of the first latch circuit units 351 to 358 is the same as the circuit structure of the first latch circuit unit 151 shown in FIG. 4.

Figure 15:
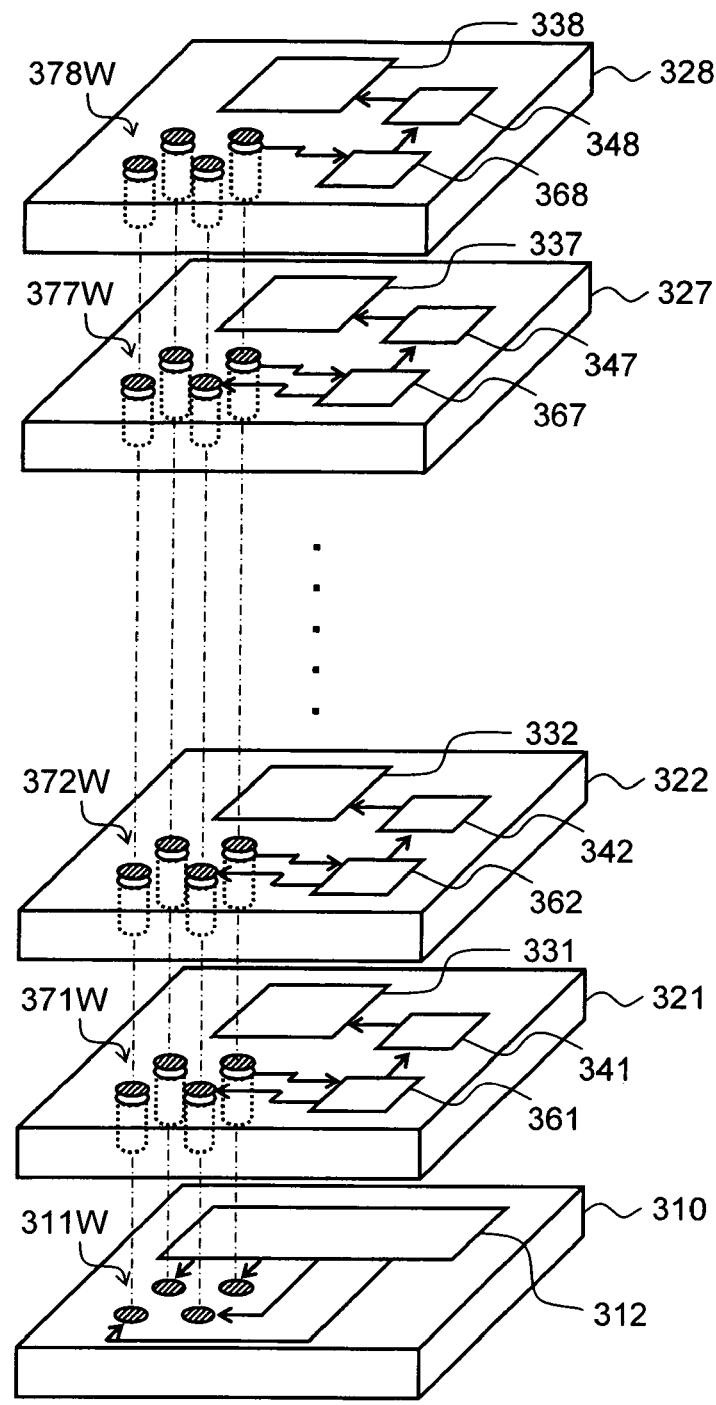
FIG. 15 is a schematic exploded perspective view of the semiconductor storage device according to the second preferred embodiment of the present invention, wherein the arrows indicate the flow of data during the write operation.

FIG. 15 is a schematic exploded perspective view of the semiconductor storage device 300, wherein the arrows indicate the flow of data during the write operation.

As shown in FIG. 15, second latch circuit units 361 to 368 are furthermore provided to the core chips 321 to 328, and four through-electrodes 371W to 378W used for writing data are provided so as to correspond to the second latch circuit units 361 to 368. These through-electrodes 371W to 378W differ from the through-electrodes 371R to 378R used during the read operation. Four write-data terminals 311W are also provided to the interface chip 310, and these write-data terminals 311W are connected to the internal circuit 312.

Figure 16:
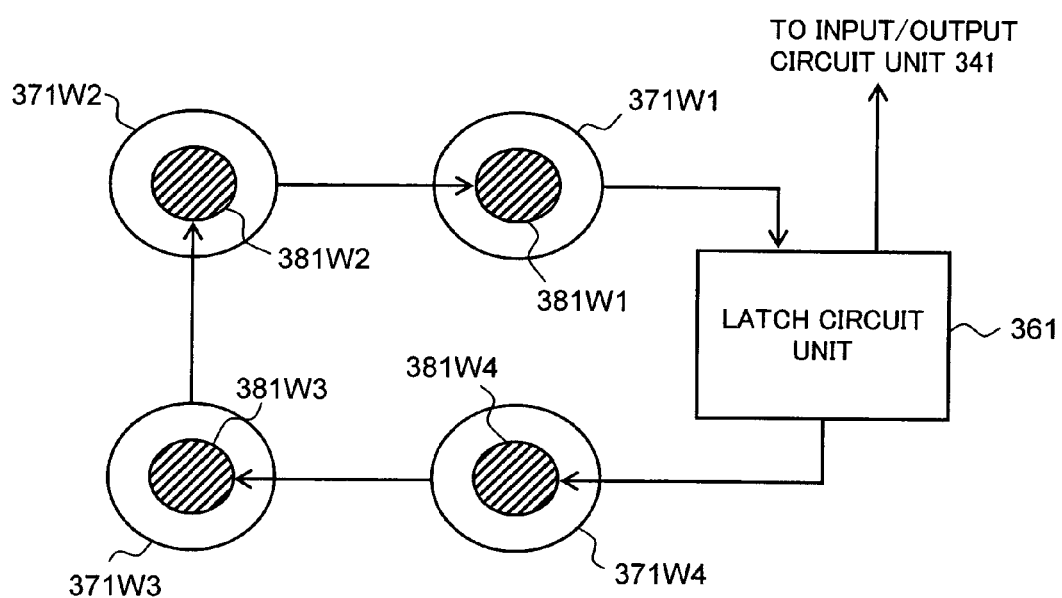
FIG. 16 is a schematic plan view showing the connection relationship between the four through-electrodes for data-writing provided to the core chip, and the corresponding surface bumps.

FIG. 16 is a schematic plan view showing the connection relationship between the four through-electrodes for data-writing provided to the core chip 321, and the corresponding surface bumps.

As shown in FIG. 16, the four through-electrodes used for writing data are also connected in cyclic fashion with respect to the surface bumps. In other words, through-electrode 371W4 is connected to surface bump 381W3, through-electrode 371W3 is connected to surface bump 381W2, through-electrode 371W2 is connected to surface bump 381W1, and through-electrode 371W1 is connected via a latch circuit unit 361 to surface bump 381W4.

Thus, only through-electrode 371W1 and surface bump 381W4 are connected to the second latch circuit unit 361, and the other through-electrodes 371R2 to 371R4 and the other surface bumps 381R1 to 381R3 are not connected to the latch circuit unit 361. Therefore, the through-electrodes and surface bumps that are not connected to the latch circuit unit 361 simply pass through the core chip 321

In the other core chips 322 to 328 as well, the through-electrodes and the surface bumps are connected to each other in cyclic fashion in the same configuration as the one shown in FIG. 16. When the core chips 321 to 328 are layered, the surface bumps and through-electrodes that are in the same planar position as viewed from the layering direction are short-circuited with each other. As in the case of the through-electrodes for reading, the planar positions of the four through-electrodes for writing and the four corresponding surface bumps are the same in the core chips 321 to 328.

The specific circuit structure of the second latch circuit units 361 to 368 is the same as the circuit structure of the second latch circuit unit 161 shown in FIG. 6.

According to the configuration described above, the eight core chips 321 to 328 are classified into four groups during both the reading operation and the writing operation.

Figure 17:
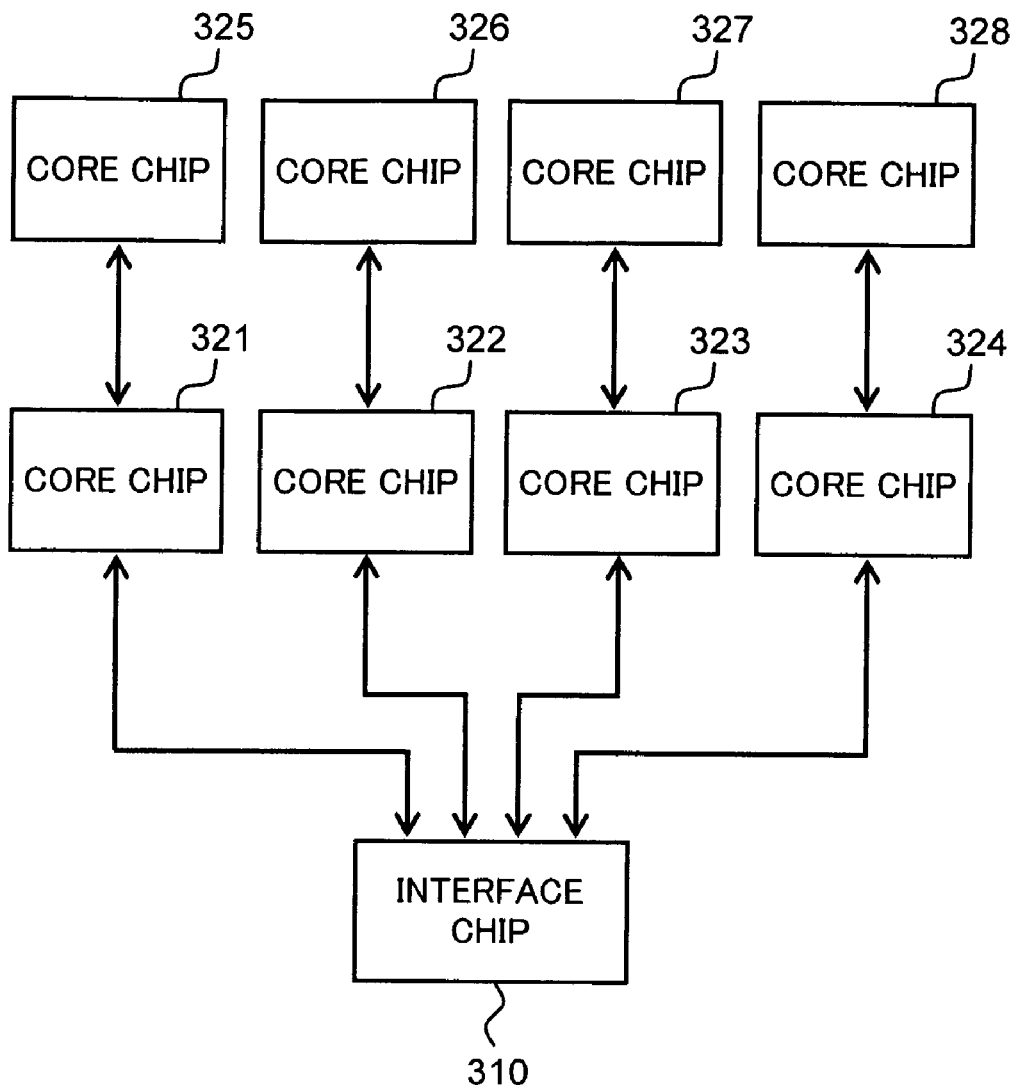
FIG. 17 is a block diagram showing four parallel two-stage pipelines.

FIG. 17 is a block diagram showing this configuration. As shown in FIG. 17, core chips 321 and 325 constitute the first group, core chips 322 and 326 constitute the second group, core chips 323 and 327 constitute the third group, and core chips 324 and 328 constitute the fourth group. The core chips belonging to each group are connected in a cascade to the interface chip 310, but are completely separated from the core chips that belong to the other groups. The latch circuit units inside core chips that belong to the same group thereby operate in synchrony with the same clock signal, and the latch circuit units inside core chips that belong to a different group operate in synchrony with a different clock signal.

Therefore, the four groups can each perform pipeline operation independently in the semiconductor storage device 300 according to the present embodiment. When there are a large number of layered core chips (eight in the present embodiment), latency in the access time increases the farther away the core chip is from the interface chip 310 when all of the core chips form a single pipeline (eight-stage pipeline), but since four two-stage pipelines are formed in parallel in the present embodiment, it becomes possible to improve the latency of the access time even when a large number of core chips are layered.

In the present embodiment, each of two adjacent core chips belongs to a different group, and the positions of core chips belonging to the same group are therefore dispersed. As a result, variation in characteristics between groups can be minimized.

The present embodiment in particular has a structure in which units composed of four core chips (core chips 321 to 324 or core chips 325 to 328) belonging to first through fourth groups are repeatedly layered. Since the core chips of each group are thereby positioned in cyclic fashion as viewed from the layering direction, the distance between the plurality of core chips that belong to the same group becomes uniform in each group, resulting in the ability to eliminate variation in characteristics between groups.

Furthermore, each of the core chips 321 to 328 has four (total of eight including those used for reading and those used for writing) through-electrodes that correspond to all of the groups, and the connection relationship of these through-electrodes is that of a spiral; specifically, the through-electrodes that correspond to the groups are arranged in a spiral. It thereby becomes possible to keep the number of through-electrodes constant; specifically, the same as the number of groups, regardless of the number of core chips layered.

In the present embodiment, the planar positions of the four through-electrodes as viewed from the layering direction are the same in each core chip. Chips having exactly the same structure can therefore be used as the eight core chips 321 to 328. Accordingly, these core chips 321 to 328 can be manufactured using the same mask.

The present embodiment also uses different through-electrodes as data transmission paths during reading and writing, but these through-electrodes may also be used for both reading and writing.

The present invention is in no way limited to the aforementioned embodiments, but rather various modifications are possible within the scope of the invention as recited in the claims, and naturally these modifications are included within the scope of the invention.

Figure 18:
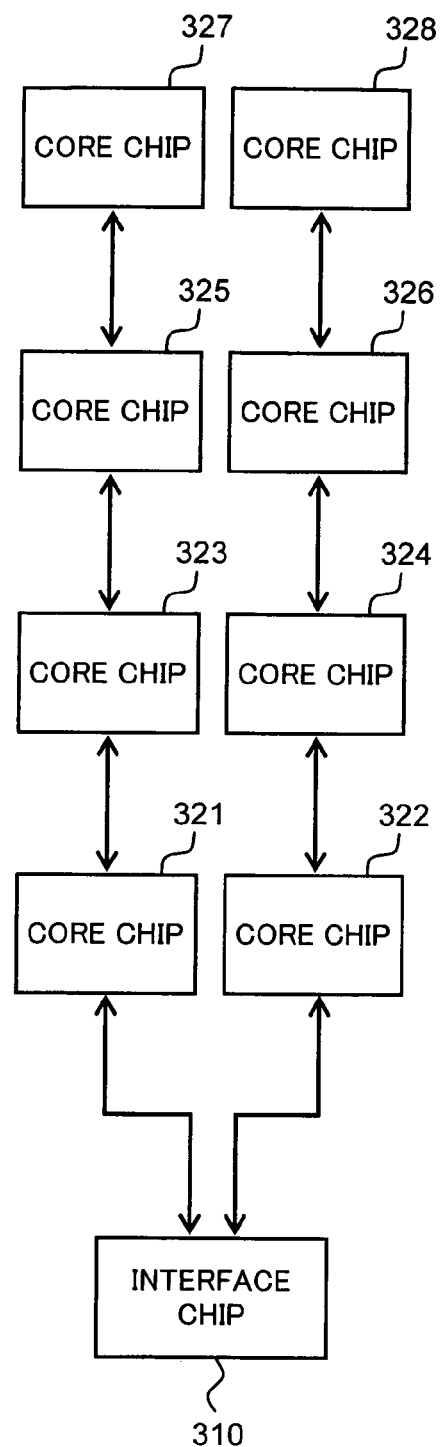
FIG. 18 is a block diagram showing two parallel four-stage pipelines.
Figure 19:
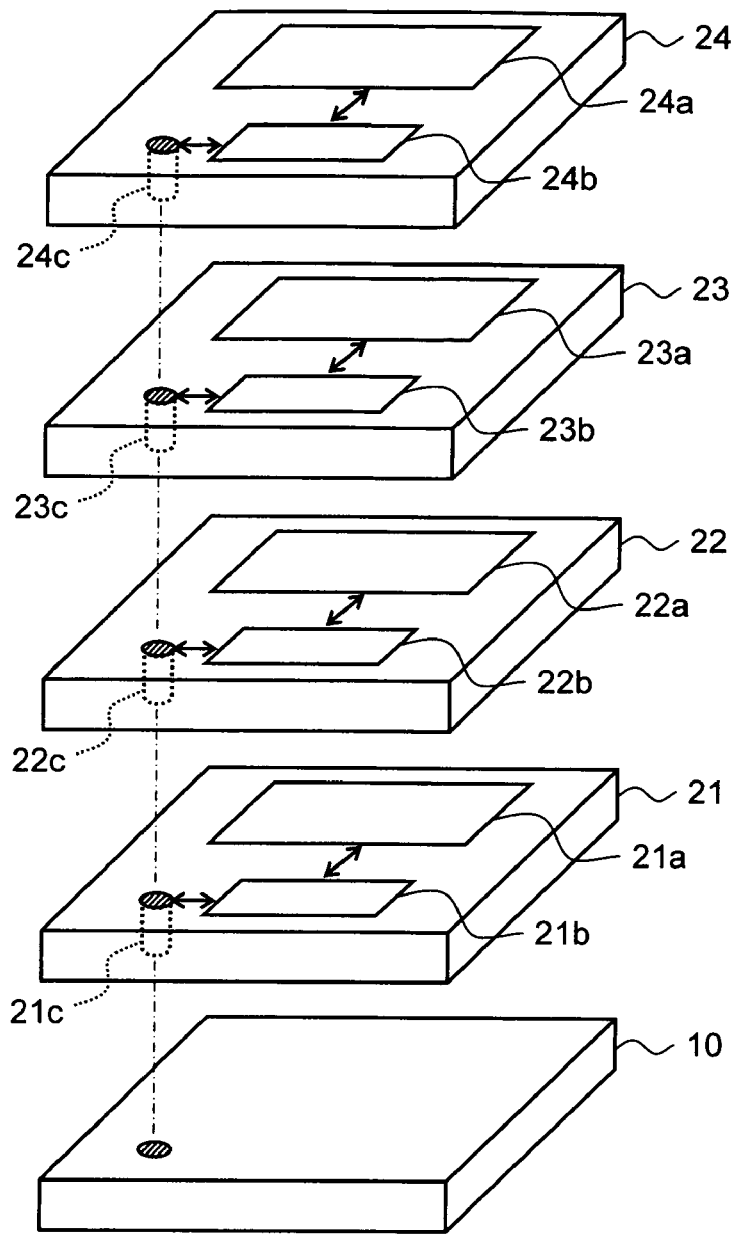
FIG. 19 is a schematic diagram of the structure of a conventional semiconductor storage device in which the core unit and interface unit are separate chips, and shows an example in which four core chips are allocated to one interface chip.

For example, four core chips were used in the first embodiment, and eight core chips were used in the second embodiment, but the number of core chips used is not particularly limited insofar as it is two or more. The number of pipelines is also not particularly limited when a plurality of groups of pipelines are formed, as in the second embodiment, and two four-stage pipelines may be formed in parallel, as shown, for example, in FIG. 18. The same effects as in the abovementioned second embodiment can be obtained in this case by wiring two adjacent core chips so that they each belong to different groups. Two each of through-electrodes for reading and through-electrodes for writing are sufficient in this case. The number of through-electrodes needed is further reduced to half by using the through-electrodes for both reading and writing.

What is claimed is:

1. A semiconductor storage device, comprising:
   a first group consisting of a plurality of core chips, each core chip having
      a memory cell, and
      a latch circuit unit for temporarily storing at least one of write data to be stored in the memory cell and read data retrieved from said memory cell; and
   an interface chip having a peripheral circuit for said cells included in said plurality of core chips; wherein
   said latch circuit units included in said plurality of core chips are connected in a cascade to said interface chip to perform one of a first operation and a second operation;
   wherein the first operation supplies write data to be stored in the memory cells serially to each of the latch circuit units from the interface chip, and then transfers the write data in parallel from the latch circuit units to their respective memory cells;
   wherein the second operation transfers read data from the memory cells to their respective latch circuit units, and then supplies the read data serially from the latch circuit units to the interface chip.

2. The semiconductor storage device as claimed in claim 1, wherein said plurality of core chips and said interface chip are layered together.

3. The semiconductor storage device as claimed in claim 2, wherein said plurality of core chips includes a first core chip and a second core chip, with the respective latch circuit units therein being connected to each other via a through-electrode provided to the first core chip.

4. The semiconductor storage device as claimed in claim 2, wherein a first latch circuit unit included in said latch circuit units included in the plurality of core chips and an internal circuit included in said interface chip are connected to each other via a through-electrode provided to the core chip including the first latch circuit unit and said interface chip.

5. The semiconductor storage device as claimed in claim 1, wherein said latch circuit units provided to each of said plurality of core chips can operate in synchrony with the same clock signal.

6. The semiconductor storage device as claimed in claim 3, further comprising:
   one or more additional groups, each additional group consisting of a plurality of core chips not included in the first group or another additional group, each core chip in the additional group comprising a memory cell and a latch circuit unit, said latch circuit for temporarily storing at least one of write data to be stored in the memory cell and read data retrieved from said memory cell;
wherein
a first plurality of groups consists of the first group and the additional groups;
in each group the latch circuit units included therein are connected in a cascade to the interface chip, said cascade not including any latch circuit units included in another group;
the interface chip has a peripheral circuit for said memory cells included in said additional groups.

7. The semiconductor storage device as claimed in claim 6, wherein the core chips included in the first plurality of groups are arranged in a single stack, and no two core chips included in the same group are stacked adjacent to each other.

8. The semiconductor storage device as claimed in claim 7, wherein the core chips of each group are repeatedly layered in cyclic fashion.

9. The semiconductor storage device as claimed in claim 8, wherein
the first core chip includes a plurality of through-electrodes, where each through-electrode is used by a single group, and a through-electrode is provided for each group included in the first plurality of groups;
a first through-electrode included in the plurality of through-electrodes is connected to the latch circuit unit included in said first core chip; and
a second through-electrode included in the plurality of through-electrodes and provided for a different group than the first through-electrode is not connected to the latch circuit unit included in said first core chip but is connected to an adjacent core chip.

10. The semiconductor storage device as claimed in claim 9, wherein said plurality of core chips further includes a third core chip included in the first plurality of groups is located adjacent to said first core chip and has a plurality of through-electrodes each corresponds to the groups in the first plurality of groups,
a through-electrode that is provided to said first core chip and that corresponds to the first group, and a through-electrode that is provided to said third core chip and that corresponds to an additional group, are in substantially the same planar position as viewed from the direction of stacking.

11. The semiconductor storage device as claimed in claim 10, wherein through-electrodes that are provided to core chips belonging to the same group have essentially the same planar position as viewed from the direction of stacking for each of the through-electrodes corresponding each of the groups, whereby the through-electrodes corresponding to the groups are arranged in a spiral pattern.

12. The semiconductor storage device as claimed in claim 3, wherein the first core chip further includes a driver circuit for supplying a current to said through-electrode based on an output of the latch circuit unit included in the first core chip, whereby signal transfer between the first and second core chips is performed according to a current mode system.

13. The semiconductor storage device as claimed in claim 12, wherein the first core chip further includes a current-supplying means that includes an N-channel MOS transistor that is connected as a diode between said through-electrode and a power source potential, and said driver circuit includes a P-channel MOS transistor that is connected between said through-electrode and said power source potential.

14. The semiconductor storage device as claimed in claim 3, wherein the first core chip further includes a constant-current circuit using a potential of said through-electrode as an electrical current source, and an output of said constant-current circuit is supplied to the latch circuit included in the first core chip.

15. The semiconductor storage device as claimed in claim 1, wherein a first chip is provided with a first latch circuit unit for temporarily storing the data output by said memory cell, and a second latch circuit unit for temporarily storing the data input to said memory cell.

16. The semiconductor storage device as claimed in claim 15, wherein said first latch circuit unit includes a multiplexer for outputting data selected from the data read from the memory cell included in the first core chip, and the data transferred by another core chip; and
said second latch circuit unit includes a selector for selectively outputting data transferred by another core chip or said interface chip to said memory cell included in the corresponding core chip or another core chip.

17. A semiconductor storage device having a plurality of semiconductor chips, said semiconductor storage device comprising
a first core chip including a first memory cell;
a second core chip including a second memory cell;
an interface chip having a peripheral circuit for said memory cells; and
a first through-electrode connecting the interface chip and the first code chip; and
a second through-electrode connecting the first and second core chips; wherein
write data for said memory cells is supplied in serial by said interface chip to the core chips via said first and second through-electrodes, and then supplied in parallel to the first and second memory cells by their respective core chips; and
read data is output in parallel by said first and second memory cells, and supplied serially from the first and second core chips to said interface chip via said first and second through-electrodes.

18. The semiconductor storage device as claimed in claim 1, wherein said latch circuit units are for temporarily storing said output data, a latch signal and a clock signal are provided to said latch circuit units, and each of said latch circuit units includes a multiplexer for selecting data from data read from said memory cell included in the corresponding core chip and data transferred by another core chip or said interface chip, according to said latch signal, and outputting the selected data in synchrony with said clock signal.

19. The semiconductor storage device as claimed in claim 1, wherein said latch circuit units are for temporarily storing said input data, a latch signal and a clock signal are provided to said latch circuit units, and each of said latch circuit units includes a selector for selecting either said memory cell included in the corresponding core chip or another core chip, according to said latch signal, and outputting data transferred by another core chip or said interface chip to the selection.

20. The semiconductor storage device as claimed in claim 1, wherein said core chips have the same structure as one another.

21. The semiconductor storage device as claimed in claim 3, wherein said at least one through-electrode includes a first through-electrode used during a read operation and a second through-electrode used during a write operation.

* * * * *